US012701964B2

(12) United States Patent
Liu et al.

(10) Patent No.: US 12,701,964 B2
(45) Date of Patent: Aug. 4, 2026

(54) METHODS AND SYSTEMS FOR DRY ETCHING

(71) Applicant: Taiwan Semiconductor Manufacturing Company, Hsinchu (TW)

(72) Inventors: Fu-Yi Liu, Hsinchu (TW); Chou Feng Li, Hsinchu (TW); Chih-Hsien Hsu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 265 days.

(21) Appl. No.: 17/899,821

(22) Filed: Aug. 31, 2022

(65) Prior Publication Data

US 2024/0071803 A1    Feb. 29, 2024

(51) Int. Cl.
| *H10P 72/76* | (2026.01) |
| *H10P 50/00* | (2026.01) |
| *H10P 50/26* | (2026.01) |
| *H10P 50/28* | (2026.01) |
| *H01J 37/32* | (2006.01) |

(52) U.S. Cl.
CPC ........ *H10P 72/7606* (2026.01); *H10P 50/267* (2026.01); *H10P 50/283* (2026.01); *H10P 50/71* (2026.01); *H10P 50/73* (2026.01); *H10P 72/7611* (2026.01); *H01J 37/32642*
(2013.01); *H01J 37/32724* (2013.01); *H01J 2237/3341* (2013.01); *H01J 2237/3345* (2013.01)

(58) Field of Classification Search
CPC .... H01J 2237/00–339; H01J 37/00–36; H01L 21/00–86
See application file for complete search history.

(56) References Cited

U.S. PATENT DOCUMENTS

| | | | | |
|---|---|---|---|---|
| 6,511,543 B1 * | 1/2003 | Stauss | ............... | H01L 21/68721 |
| | | | | 118/503 |
| 2022/0020568 A1 * | 1/2022 | Shindo | ............. | H01J 37/32146 |

FOREIGN PATENT DOCUMENTS

| | | | | |
|---|---|---|---|---|
| EP | 1058292 A2 * | 12/2000 | .......... | C23C 14/042 |
| EP | 2457710 B1 * | 6/2017 | .......... | B29C 31/008 |
| KR | 100854974 B1 * | 8/2008 | | |

* cited by examiner

*Primary Examiner* — Duy Vu N Deo
*Assistant Examiner* — Andrew Keelan Laobak
(74) *Attorney, Agent, or Firm* — Lippes Mathias LLP

(57) ABSTRACT

Methods and systems for dry etching are disclosed. The system includes a wafer clamp ring having a central opening through which a substrate may be treated and a plurality of smaller, outer support holes for receiving pins from plunger assemblies. The outer support holes are tapered and change in diameter. The tapered shape reduces horizontal shifting of the wafer clamp ring which can occur as the wafer clamp ring is moved up-and-down during operational use. The reduced shifting increases wafer yield along the edges of the wafer.

20 Claims, 8 Drawing Sheets

METHODS AND SYSTEMS FOR DRY ETCHING

BACKGROUND

Integrated circuits are formed on a semiconductor wafer. Photolithographic patterning processes use ultraviolet light to transfer a desired mask pattern to a photoresist on a semiconductor wafer. Etching processes may then be used to transfer to the pattern to a layer below the photoresist. This process is repeated multiple times with different patterns to build different layers on the wafer substrate and make a useful device. Plasma treatment is used for various applications in the integrated circuit production process, such as cleaning the wafer or for etching.

The semiconductor wafer substrate may be extremely thin, and can easily warp or take on a non-planar profile. This can result in non-uniform thicknesses of layers on different chips across the wafer substrate surface. A wafer clamp ring can be used to flatten and hold the semiconductor wafer substrate in place. However, after extended use, the wafer clamp ring may shift horizontally due to tolerances between the various parts. This can lead to etch defects in the chips produced on the edge of the wafer substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
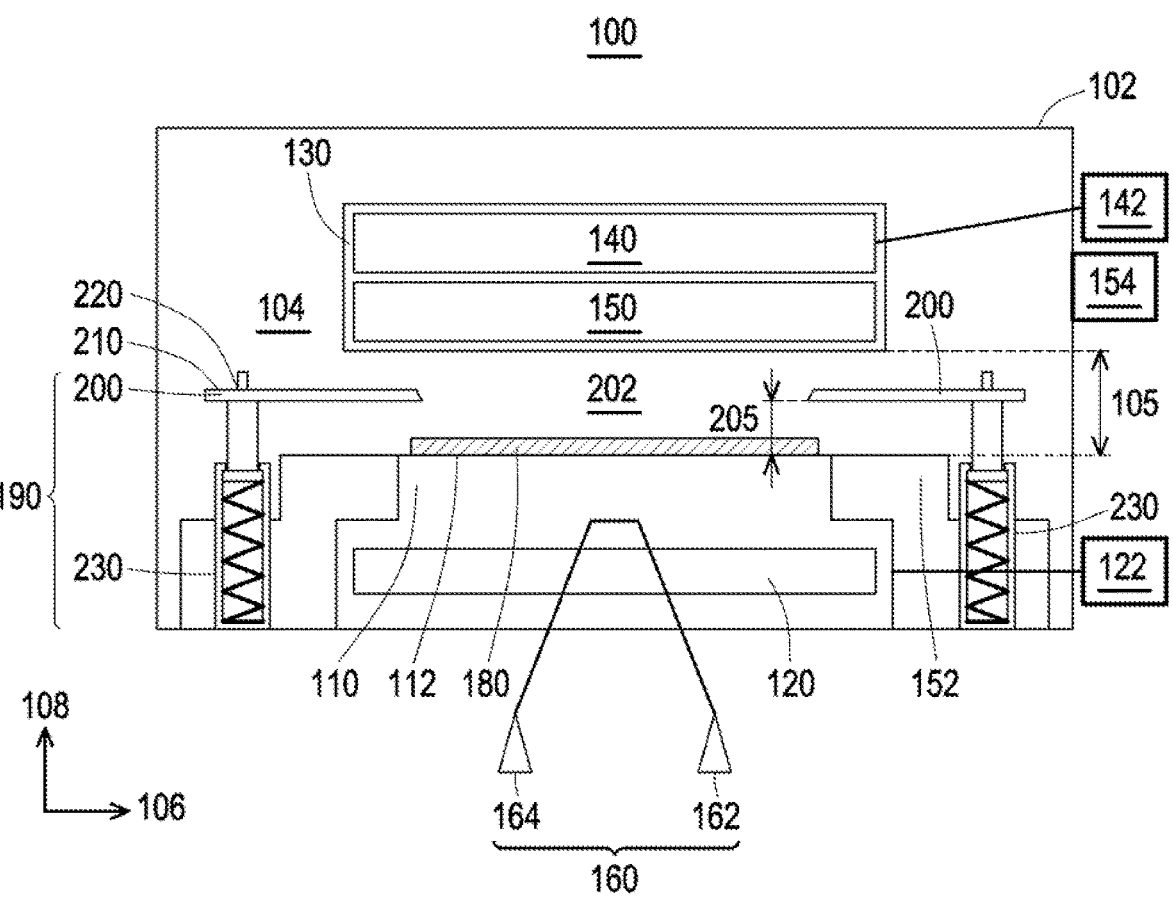
FIG. 1 is a cross-sectional schematic diagram of an example plasma treatment system suitable for dry etching in accordance with some embodiments of the present disclosure. The upper electrode is in a raised position.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The terms "horizontal" and "vertical" are used to indicate direction relative to an absolute reference, i.e. ground level. Movement in the horizontal direction/plane will not change elevation, whereas movement in the vertical direction does change elevation. These terms should not be construed to require structures to be absolutely parallel or absolutely perpendicular to each other. For example, a first vertical structure and a second vertical structure are not necessarily parallel to each other.

The present disclosure relates to devices and methods for performing dry etching, for example via plasma treatment. Plasma treatment and plasma treatment tools are commonly used in integrated circuit fabrication processes. Those manufacturing steps and applications can include the cleaning of wafer substrates, etching processes, and wafer bonding processes such as fusion bonding. Very generally, plasma is produced by applying a radiofrequency (RF) electromagnetic field through a gas between two electrodes. The RF field ionizes the gas molecules and strips them of their electrons, creating a plasma. The ions bombard the wafer substrate, resulting in the desired functions. In certain etchers that use inductively coupled plasma (ICP) or transformer-coupled plasma (TCP), the electrode(s) is separated from the plasma by a dielectric window. Compared to wet etching, some advantages of dry etching can include the ability to obtain anisotropic etch, reduced material waste, improved critical dimension (CD) control, cleaner surfaces, and reduced corrosion of metal features.

The dry etching systems of the present disclosure use a wafer clamp ring to hold the wafer substrate in place and to render it flat. The support holes which join the wafer clamp ring to the remainder of the assembly are modified to include a tapered shape instead of a cylindrical shape. This reduces horizontal shifting of the wafer clamp ring that may otherwise occur. Although described with specific reference to a dry etching system, the present disclosure can be applied to any system that uses a wafer clamp ring to hold a substrate in place for any application (e.g. etching, deposition, etc.).

Figure 2:
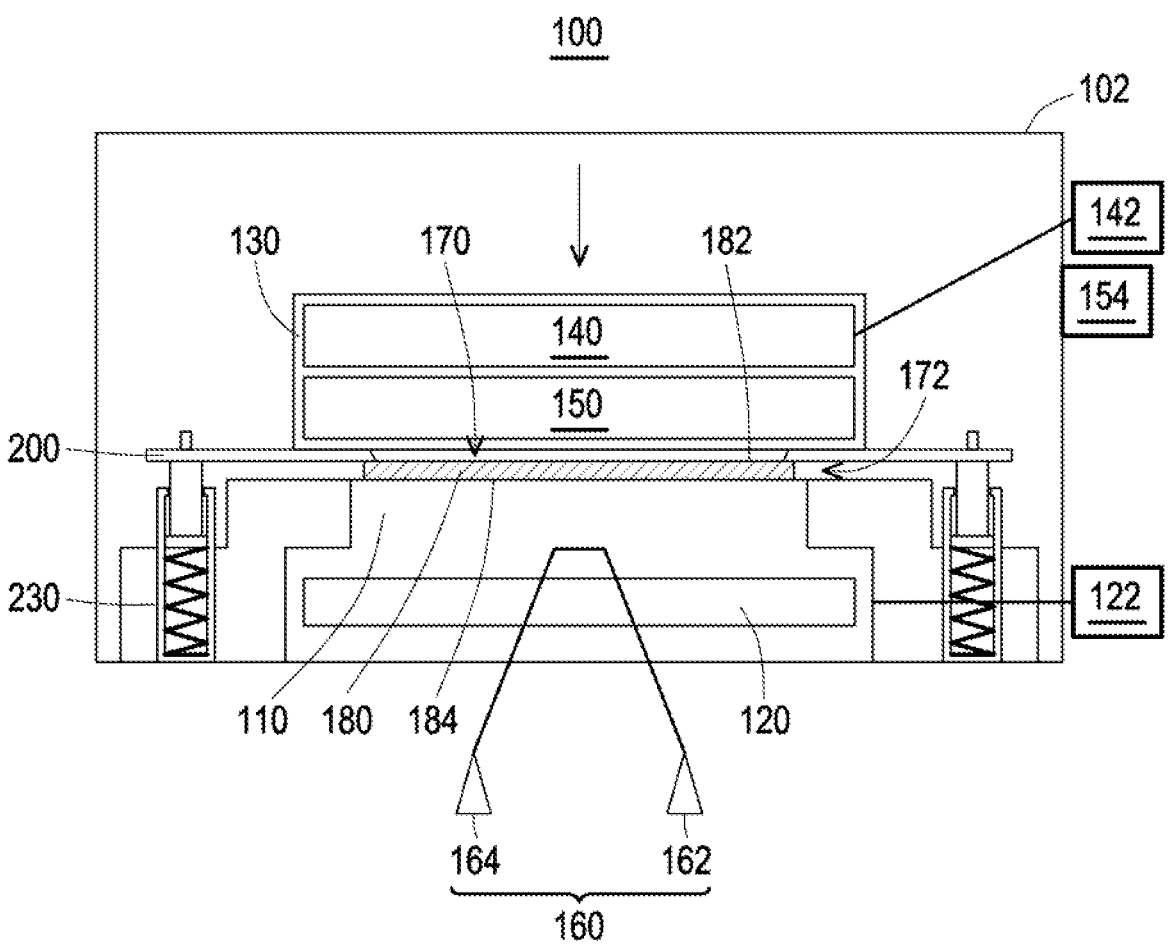
FIG. 2 is a cross-sectional schematic diagram of the example plasma treatment system of FIG. 1, with the upper electrode in a lowered position.

FIG. 1 and FIG. 2 are side cross-sectional schematic diagrams of one example of a dry etching system 100, in accordance with some non-limiting embodiments of the present disclosure. Referring first to FIG. 1, generally, the system 100 includes a housing 102 that contains a reaction chamber 104. A wafer support pedestal 110 containing a lower electrode 120 is located near the bottom of the housing. The horizontal direction is indicated with reference numeral 106, and the vertical direction is indicated with reference numeral 108.

A platform 130 is located near the top of the housing. An upper electrode 140 is present within the platform 130. The bottom of the platform includes a showerhead 150 through which process gases are introduced into the reaction chamber 104. Gas lines (not shown) are also present for supplying the appropriate process gases. The showerhead and/or gas lines are connected to gas sources (not shown) for providing the specified gas.

The platform 130 (containing the upper electrode 140) and the wafer support pedestal 110 are separated by a variable gap 105. The platform and the wafer support pedestal are also adapted to move relative to each other, so that the size of the gap can increase and decrease. This can be, for example, by moving the platform up and down using screws, gears, or other conventional mechanical structures while the wafer support pedestal remains fixed in place. In FIG. 1, the platform is in a raised position relative to the wafer support pedestal. In FIG. 2, the platform has moved down within the housing to a lowered position relative to the wafer support pedestal. The gap may be up to about 6.5 centimeters.

The electrodes are used to provide energy for ionizing gas molecules so as to generate a plasma. Radiofrequency (RF) generators are present for applying RF power. A lower RF generator 122 is coupled to the lower electrode 120, and an upper RF generator 142 is coupled to the upper electrode 140. The upper electrode and the lower electrode are ideally concentric with the wafer substrate.

The platform 130 may be made of a material that is configured to transmit RF energy, or in other words the dome is generally transparent to RF. This permits transmission of an RF induction field through the platform. Thus, the platform desirably has a low impedance to the RF induction field or has an electric field susceptibility sufficiently low to transmit the induction field with minimal power loss. A suitable composition for the platform has high transmittance (i.e., low loss tangent) across RF frequencies. If RF transmittance is low, energy may undesirably be absorbed and converted into excessive heat. Such heat may both degrade the plasma generation process due to lost RF energy while also causing excessive heating of components and the creation of thermal gradients. The platform should also resist erosion from the plasma.

In some embodiments, the platform 130 is made of a ceramic material. Non-limiting examples of ceramic materials that can be used to make the dome include silicon, silicon dioxide ($SiO_2$), silicon carbide, alumina ($Al_2O_3$), germanium, Group III-V compound semiconductors such as gallium arsenide and indium phosphide, and Group II-II-V compound semiconductors such as mercury cadmium-telluride. In some specific embodiments, the platform is made from silicon dioxide ($SiO_2$) or alumina ($Al_2O_3$).

Continuing with reference to FIG. 1, a wafer support pedestal 110 is present within the housing. The pedestal is configured to hold a semiconductor wafer substrate 180 in a desired position. Generally, the wafer substrate may have any suitable diameter, and in particular embodiments may have a diameter of from about 100 mm to about 450 mm. The pedestal includes a support surface 112 which contacts the wafer substrate. The support surface itself is usually made of an electrically insulating material.

A wafer clamping assembly 190 is present upon the wafer support pedestal 110. The wafer clamping assembly includes a wafer clamp ring 200 and a plurality of plunger assemblies 230 which connect the wafer clamp ring to the wafer support pedestal.

The wafer clamp ring 200 includes a body 210, which is seen in two parts in this cross-sectional view. The body has an annular shape, and surrounds a central opening 202 through which the wafer 180 can be plasma treated. The body of the wafer clamp ring 200 also includes a plurality of outer support holes or openings 220. A plunger assembly 230 passes through each outer support hole to join the wafer clamp ring to the wafer support pedestal.

Referring to FIG. 1, the wafer clamp ring 200 and the wafer support pedestal 110 are separated by a resting height 205. While the resting height may vary, in some specific embodiments, the resting height is from about 1.1 centimeters (cm) to about 1.3 cm. This resting height is attained when no load is applied to the wafer clamp ring 200.

A focus ring 152 may also be present on the wafer support pedestal 110, surrounding the wafer support surface 112. The focus ring is designed to improve etch uniformity around the wafer edge or perimeter, by permitting the plasma to extend beyond the wafer perimeter. The focus ring is typically made of an insulating material, e.g. quartz, and is a consumable part that is periodically replaced.

One or more gas outlets may also present for removing undesired gases from the reaction chamber and for reducing the pressure within the reaction chamber. A gas outlet can be connected to a pump (not shown) for creating vacuum. One or more load-locks may also be present for accessing the reaction chamber to insert and remove the wafer substrate, which can be done using an automated material handling system (AMHS).

A controller 154 can be used to control the various inputs and outputs, and to measure various conditions within the housing for the plasma treatment process. The system may also include sensors (not shown) for monitoring applicable parameters. For example, such sensors may include those for tracking the flow rate of various gases, for measuring the content of gases exiting the reaction chamber, for measuring the pressure within the reaction chamber, the temperature of the wafer substrate, the temperature of any inlet gases, etc. The controller can also determine whether to activate or deactivate the system, how to vary the voltage to the electrodes, how to vary the gas mixture, how fast/strongly the gas should flow into the reaction chamber, and potentially also control the motion of any automated material handling system that may be present, etc. It is noted that these various parameters may not have to be held steady during operation, and could be changed by the controller operating a computer program which alters their setpoints as appropriate. The controller may also include a user interface for communicating with operators. If desired, different controllers may be used for controlling the plasma generating chamber and the plasma treatment chamber.

The controller may be implemented on one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. Such devices typically include at least memory for storing a control program (e.g. RAM, ROM, EPROM) and a processor for implementing the control program.

The various components of the dry etching system may be made using materials and processes known in the art. Examples of suitable materials can include metals, plastics, etc. Common enhancements may also be used. For example, the various surfaces within the reaction chamber may include a protective coating.

Referring now to FIG. 2, as illustrated here, the platform 130 has moved downwards and now pushes down on the wafer clamp ring 200. In turn, the wafer clamp ring 200 now engages the wafer substrate 180.

During plasma treatment, the wafer substrate will heat up. A backside cooling system 160 may be present within the wafer support pedestal. The backside cooling system provides a cooling fluid to the backside of the wafer substrate to transfer heat away from the wafer substrate. In this regard, the wafer clamping assembly 190 may also be described as separating the reaction chamber 104 into a plasma treatment volume 170 and a backside cooling volume 172. The plasma treatment volume 170 is present along a front side 182 of the wafer substrate, between the wafer clamping assembly 190 and the upper electrode 140. The backside cooling volume 172 is present along a back side 184 of the wafer substrate, between the wafer clamping assembly 190 and the wafer support pedestal 110.

Continuing, the cooling fluid may be a liquid or gas, but is usually a gas such as helium ($He_2$). As illustrated here, the backside cooling system includes an inlet 162 and an outlet 164 that pass through the pedestal. The cooling fluid flows through the inlet into the region between the wafer substrate and the lower electrode to the outlet, thus transferring heat away. For example, the wafer support surface may include grooves (not shown) through which the cooling fluid flows. Alternatively, the cooling fluid/gas may flow radially outward from the center of the pedestal and be vented along the perimeter of the wafer, where the gas is withdrawn through an outlet surrounding the pedestal. The wafer clamp ring may help ensure that any cooling fluid which escapes the cooling system does not adversely affect the plasma treatment process occurring in the plasma treatment volume 170. The wafer clamp ring presses against the perimeter of the wafer substrate, reducing the loss of the cooling fluid and thus increasing the cooling effect.

Figure 3:
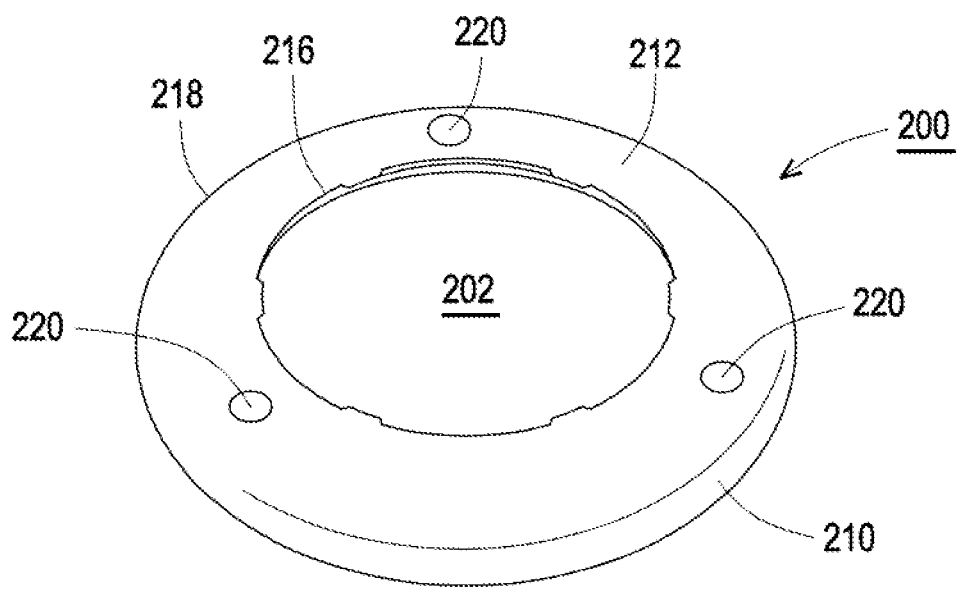
FIG. 3 is a perspective view of a wafer clamp ring, in accordance with some embodiments.

FIG. 3 is a perspective view of the wafer clamp ring 200. The clamp ring may be described as an annular body 210 that surrounds a central opening 202 which exposes the wafer to plasma. The body 210 includes a plurality of outer support holes 220, which extend entirely through the body from the lower surface (not visible) to the upper surface 212 thereof. As illustrated here, three outer support holes are visible, which are generally spaced evenly around the circumference of the body. The body includes an inner perimeter 216 proximate the central opening 202 and an outer perimeter 218 around the outside of the annular body.

In some embodiments, the wafer clamp ring may be made from anodized aluminum. Anodizing is an electrochemical process that converts an aluminum surface into a durable, corrosion-resistant anodic oxide finish. In other embodiments, the wafer clamp ring 200 is made from a ceramic material. Non-limiting examples of ceramic materials include alumina ($Al_2O_3$), carbides, oxides, silicides, borides, and nitrides. Other materials are also within the scope of the present disclosure.

Figure 4:
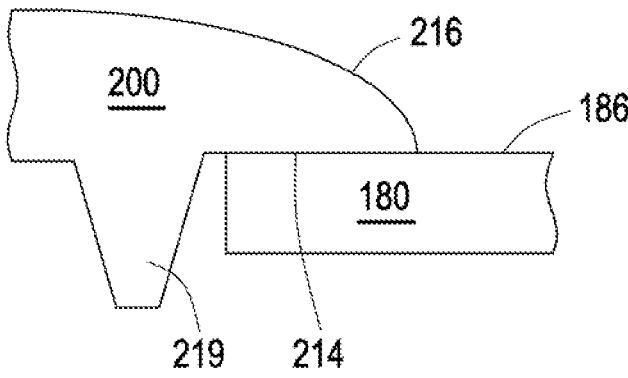
FIG. 4 is a partial side cross-sectional view illustrating the inner perimeter of the wafer clamp ring when clamped against a wafer substrate.

FIG. 4 is a partial side cross-sectional view illustrating the inner perimeter 216 of the wafer clamp ring 200 when clamped against a wafer substrate 180. Generally, the inner perimeter of the wafer clamp ring contacts the outer perimeter of the upper surface of the wafer substrate and exerts a downward force on the wafer. Here, the lower surface 214 of the annular body engages the upper surface 186 of the wafer substrate 180 along the perimeter of the wafer. The lower surface 214 of the wafer clamp ring 200 may also include a tapered cylindrical wall 219 which projects perpendicularly from the annular body and engages the perimeter of the wafer substrate. When present, the cylindrical wall is intended to funnel the wafer substrate into a closer horizontal or lateral alignment with the wafer clamp ring and the wafer support pedestal.

Figure 5:
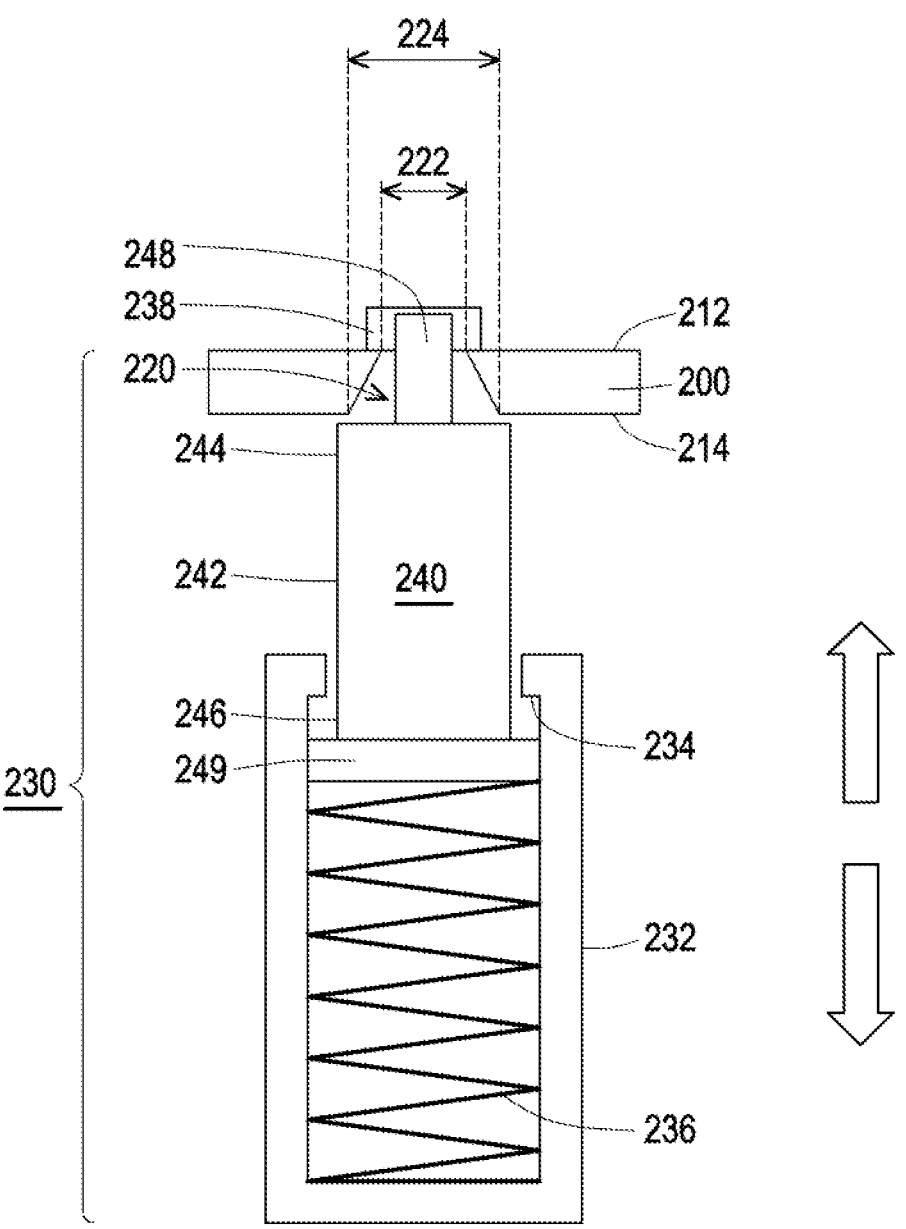
FIG. 5 is a magnified cross-sectional view of the plunger assembly engaged with a wafer clamp ring, in accordance with some embodiments.

FIG. 5 is a magnified cross-sectional view of the plunger assembly 230 and the wafer clamp ring 200. Referring first to the plunger assembly 230, the plunger assembly includes a piston shaft 232, a compression spring 236, a plunger 240, and a cover 238.

Initially, the piston shaft 232 can be described as a tube formed a cylindrical sidewall. The lower end of the tube is closed off, and the upper end of the tube is a circular wall with an opening in the center thereof, through which the plunger 240 extends. The remainder of the circular wall acts as a stop surface 234.

The plunger 240 is formed from a body 242 having an upper end 244 and a lower end 246. A pin 248 is present at the upper end of the body of the plunger, and is the portion of the plunger that passes through the outer support hole of the wafer clamp ring. The pin has a smaller diameter than the body. The lower end of the body of the plunger includes a lip 249 which is located within the piston shaft 232, and engages the stop surface 234.

The compression spring 236 is located within the piston shaft, and is biased against the lower closed end of the piston shaft 232 and the lower end of the plunger 240. The compression spring is long when no load is applied, and gets shorter as a load is applied. The compression spring biases the plunger 240 upwards and away from the wafer support pedestal and the wafer substrate. The spring compresses when the plunger 240 is pushed into the piston shaft 232, and expands when load is removed.

The cover 238 engages the pin 248 of the plunger, and secures the wafer clamp ring 200 to the plunger assembly.

The various components of the plunger assembly are made from suitable materials. For example, the spring is usually made from a metal material. The piston shaft, the plunger, and the cover are usually made of a suitable plastic material.

Referring now to the wafer clamp ring 200, an outer support hole 220 is illustrated in the body 210. The outer support hole 220 extends entirely through the body, from the lower surface 214 to the upper surface 212 thereof. The outer support hole tapers inwards from the lower surface to the upper surface. As a result, the top diameter 222 of the outer support hole (i.e. at the upper surface) is less than the bottom diameter 224 of the outer support hole (i.e. at the lower surface). The bottom diameter 224 may provide a tolerance of about 1.25 mm, or about 0.625 mm on each side of the pin 248. However, the tolerance is lower at the top diameter. In some embodiments, the top diameter is about 5 millimeters (mm). As illustrated here, the outer support hole has a conical shape, or a linear taper. However, it should be understood that other shapes are also contemplated. For example, the outer support hole may have a curved taper. Having only one or two points of contact between the plunger assembly and the wafer clamp ring increases the stability of the wafer clamp ring.

A separate plunger assembly 230 is associated with each of the outer support holes of the wafer clamp ring. The complementary nature of the outer support holes and pins is believed to limit movement of the wafer clamp ring 200 in the x-y plane (i.e., horizontally). The conical shape of the outer support hole reduces the tolerance of the overall outer support hole, which advantageously reduces the amount of horizontal movement that can occur with the wafer clamp ring. In turn, this eliminates or reduces the likelihood that the wafer clamp ring 200 is horizontally offset from the wafer during the etching process, which can cause undesirable effects along the wafer edge, such as portions of the edge of the wafer not being uniformly etched.

The wafer clamp ring 200 of the present disclosure can be used in any etching process, including reactive ion etching (RIE), inductively coupled plasma (ICP) etching, CCP etching, sputter etching, or any combination of two or more thereof.

Figure 6:
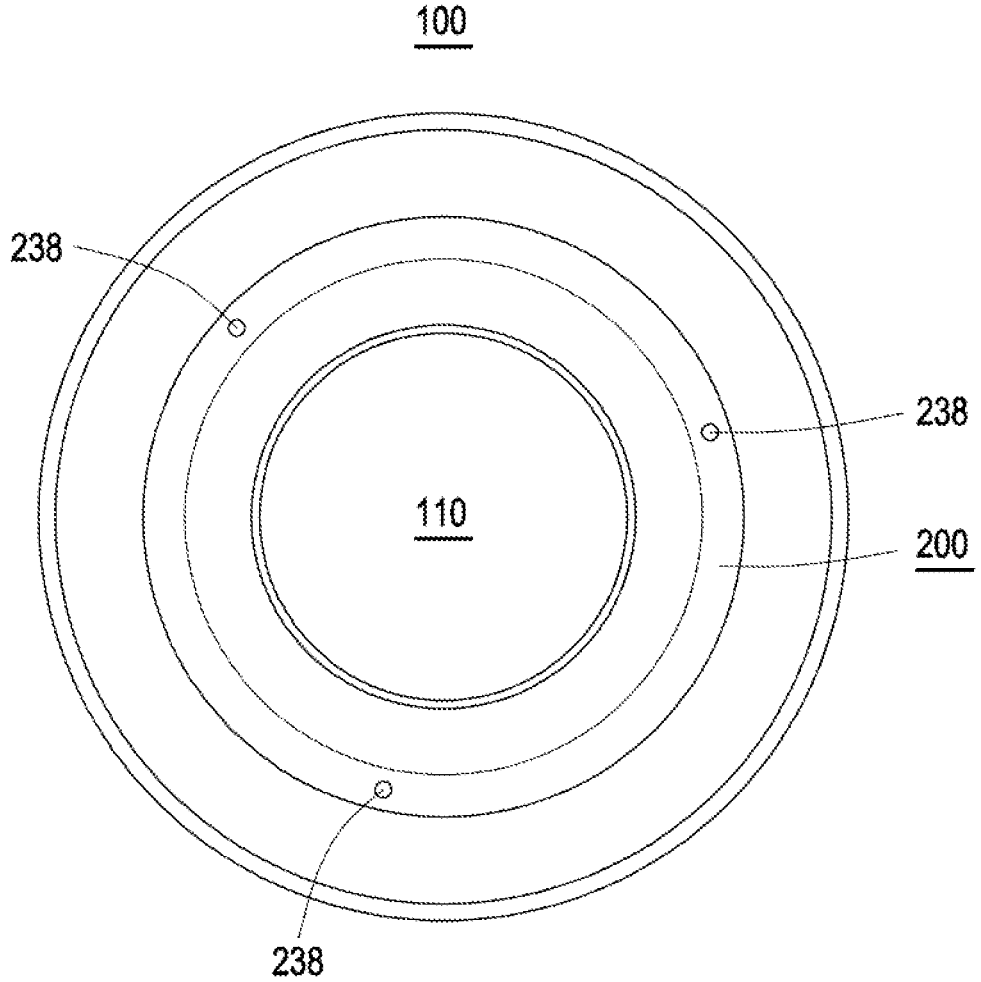
FIG. 6 is a top view of an example dry etching system in accordance with some embodiments of the present disclosure.

FIG. 6 is a top view of a dry etching system 100 in accordance with some embodiments of the present disclosure. The system 100 includes a wafer clamp ring 200 above a pedestal 110 for supporting a wafer (not shown). Plunger covers 238 of three plunger assemblies are visible at the outer support holes extending through the wafer clamp ring. The pedestal 110 is visible through the much larger central opening in the wafer clamp ring 200. It is noted that although the depicted system uses three plunger assemblies, in principle, the number of plunger assemblies used with the wafer clamp ring can vary from two to as many as desired. For example, between two and twenty plunger assemblies may be used. The plunger assemblies may be distributed evenly about the wafer clamp ring, or can be irregularly distributed.

Figure 7:
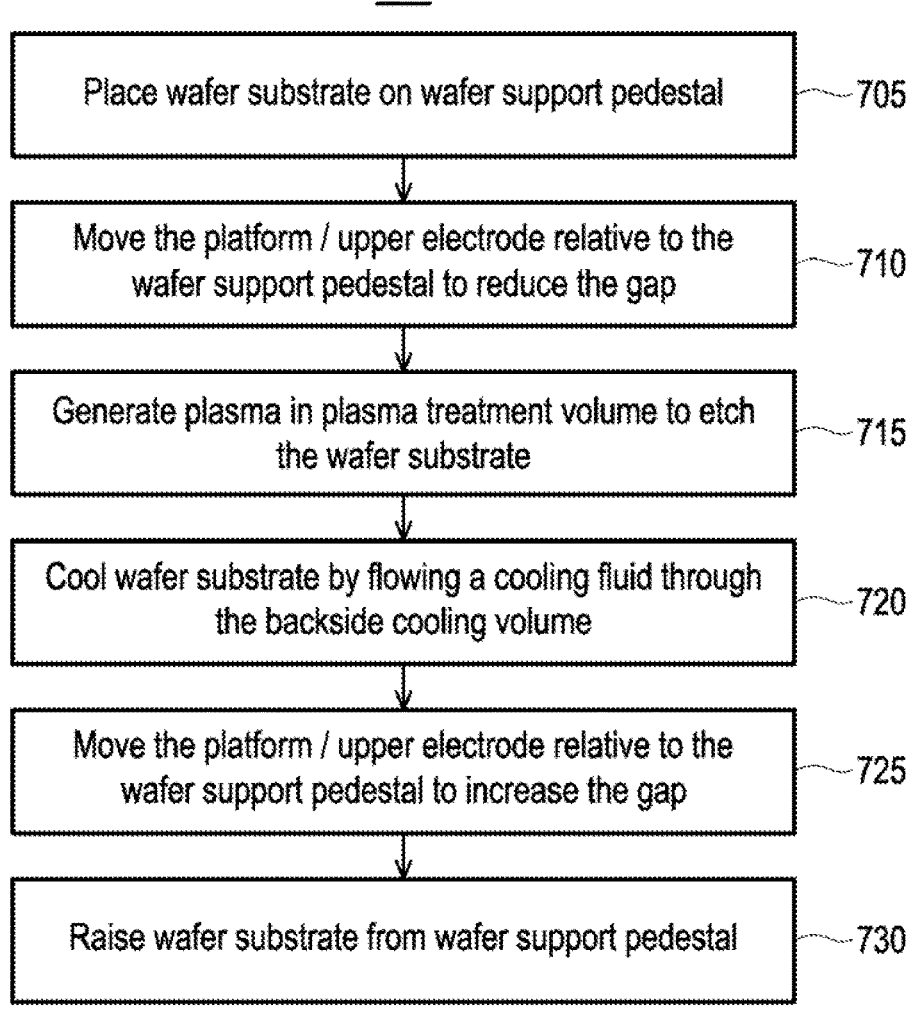
FIG. 7 is a flow chart illustrating a process for dry etching, in accordance with some embodiments.

FIG. 7 is a flow chart illustrating a non-limiting embodiment of a process 700 for dry etching, in accordance with some embodiments of the present disclosure. The various steps of the process may be discussed with reference to FIG. 1 and FIG. 2.

Initially, the process may begin with the dry etch system in the configuration illustrated in FIG. 1. The platform 130 containing the upper electrode 140 is raised away from the support pedestal 110, and the gap 105 is large.

In step 705, a wafer substrate 180 is placed on the wafer support pedestal. This may be done, for example, using a robotic arm of an AMHS to insert the wafer substrate into the reaction chamber through a load-lock (not shown) and place the wafer substrate on the support pedestal. The wafer substrate itself can be a wafer made of any semiconducting material. Such materials can include silicon, for example in the form of crystalline Si or polycrystalline Si. In alternative embodiments, the substrate can be made of other elementary semiconductors such as germanium, or may include a compound semiconductor such as silicon carbide (SiC), gallium arsenide (GaAs), indium arsenide (InAs), and indium phosphide (InP).

Next, in step 710, the platform 130/upper electrode 140 is moved relative to the wafer support pedestal 110 to reduce the gap 105. This movement causes the platform 130 to push the wafer clamping assembly 190/wafer clamp ring 200 to engage the edge (i.e. perimeter) of the wafer substrate. As best seen in FIG. 2, this creates a plasma treatment volume 170 and a backside cooling volume 172.

Then in step 715, a plasma is generated in the plasma treatment volume 170, which etches the wafer substrate 180. Voltage provided by the RF generators is applied between the upper electrode 140 and the lower electrode 120 to ignite and sustain a plasma. The frequency is usually operated at 13.56 MHz, although other frequencies such as 2 MHz or 60 MHz may be used, depending on the application. The power used to generate the plasma may range from about 10 watts (W) to about 2,000 W. Once ignited, the plasma can be sustained by electric currents produced by electromagnetic induction associated with time-varying magnetic fields, or can become self-sustaining.

In some specific embodiments, the plasma etch treatment is performed in a vacuum environment, for example with the pressure within the housing being from about 0.1 pascals (Pa) to about 100 Pa. However, the pressure may be higher and could simply be sub-atmospheric, for example a pressure of about 10 kPa to about 95 kPa (for comparison, atmospheric pressure is about 101 kPa). The temperature in the plasma treatment volume above the wafer substrate may be of any value, and in specific embodiments is in the range of about 70° C. to about 80° C.

Depending on the application, the process gases in the plasma may include argon (Ar), carbon tetrafluoride ($CF_4$), fluoroform ($CHF_3$), nitrogen ($N_2$), and/or oxygen ($O_2$). Various etching processes may include a contact oxide etch with high selectivity for polysilicon; an anisotropic via etch process; a process for etching oxide spacers; a photoresist/oxide etchback planarization etch; a tapered contact etch; soft etch; anisotropic dielectric etch; or a silicon nitride etch. During the etching, as indicated in step 720, the wafer may be cooled by flowing a cooling fluid through the backside cooling volume.

In step 725, after etching is complete, the platform 130/upper electrode 140 is raised away or separated from the support pedestal 110. The gap 105 is thus increased. This movement causes the wafer clamping assembly 190/wafer clamp ring 200 to disengage from the edge (i.e. perimeter) of the wafer substrate 180. In step 730, loading pins present in the support pedestal may then be raised to elevate the wafer substrate above the wafer support surface and to dissipate any residual charge that might be present on the wafer substrate. Automated handling tools (not shown) can then grasp the wafer substrate for transport to a subsequent processing tool for additional processing. Such processing may include further etching, deposition, testing, etc.

The dry etching system or tool can be used, for example, to form trenches and/or vias in a layer, and is a highly anisotropic process for obtaining high aspect ratios (i.e. predominantly vertical walls). For dry etching, for example, a patterned photoresist layer is present over a metal layer on the wafer substrate. The dry etching tool is then used to etch the exposed metal from the wafer substrate.

Figure 8:
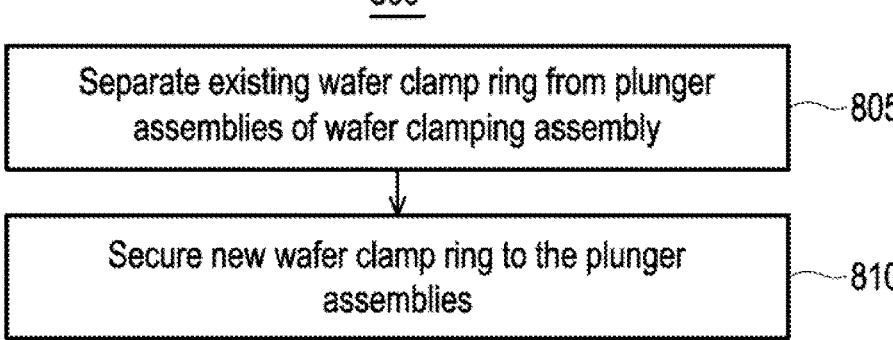
FIG. 8 is a flow chart illustrating a process for reducing horizontal shift of a wafer clamp ring in a dry etching system, in accordance with some embodiments.

FIG. 8 is a flow chart illustrating a non-limiting embodiment of a process 800 for reducing horizontal shift of a wafer clamp ring in a dry etching system, in accordance with some embodiments of the present disclosure. In step 805, an existing wafer clamp ring is separated from the plunger assemblies of the wafer clamping assembly. In step 810, a new wafer clamp ring is secured to the plunger assemblies.

The new wafer clamp ring includes outer support holes with a tapered shape, as previously described. This structure reduces the amount of horizontal shift that can occur, and results in a refurbished dry etching system which has improved operation.

Figure 9:
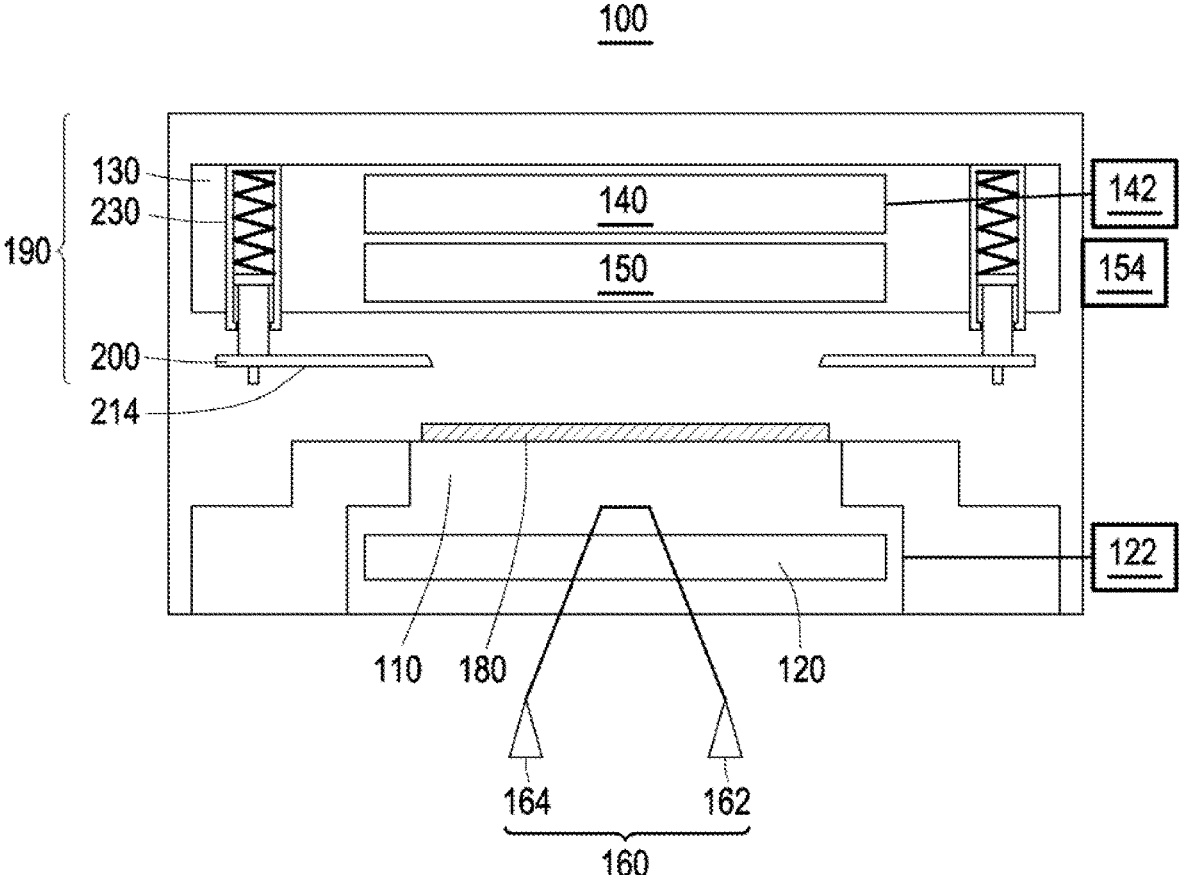
FIG. 9 is a second embodiment of a dry etching system according to the present disclosure. Here, the wafer clamping assembly is attached to the upper platform, rather than the lower wafer support pedestal.

FIG. 9 is a second embodiment of a dry etching system according to the present disclosure. This embodiment differs from that of FIG. 1 in that the wafer clamping assembly 190 is attached to the platform 130, rather than to the wafer support pedestal 110. The plunger assemblies 230 extend downward from the platform. The wafer clamp ring 200 is oriented so that the lower surface 214 thereof still contacts the wafer substrate 180. It is noted that the tapered shape of the outer support hole still reduces horizontal shift. In operation, the wafer clamp ring 200 is pushed downwards against the wafer support pedestal 110 when the platform 130 is lowered, thus clamping the wafer substrate 180.

Figure 10A:
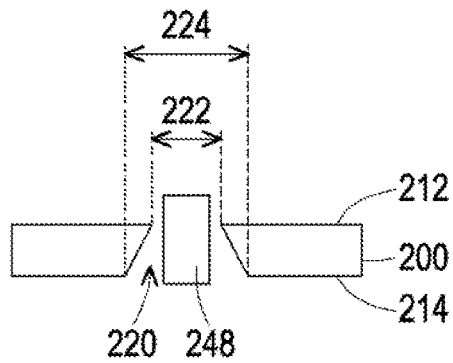
FIGS. 10A-10C are magnified cross-sectional views, showing variations in the shape of the outer support hole of a wafer clamp ring.
Figure 10B:
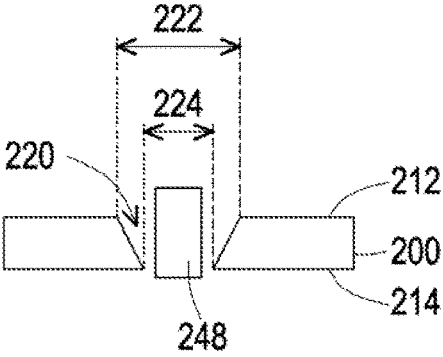
Figure 10C:
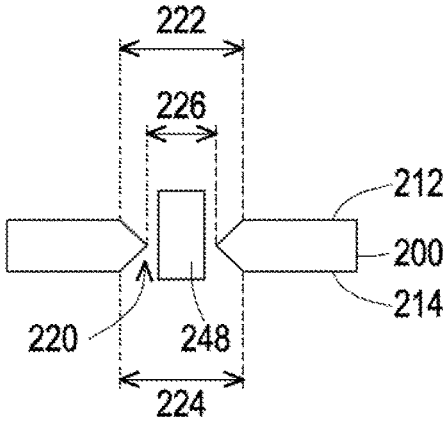

Thus, multiple variations on the shape of the outer support hole in the wafer clamp ring are contemplated in the present disclosure. Generally, the diameter of the outer support hole changes, rather than remaining constant. Some variations are illustrated in FIGS. 10A-10C, which are illustrative magnified cross-sectional views of the wafer clamp ring 200. In all three figures, the pin 248 of the plunger is included for reference. It is also noted that in all three figures, the lower surface 214 contacts the wafer substrate.

Referring first to the embodiment of FIG. 10A, the outer support hole 220 of the wafer clamp ring 200 is tapered from the lower surface 214 toward the upper surface 212. As a result, the top diameter 222 of the outer support hole along the upper surface 212 is less than the bottom diameter 224 of the outer support hole along the lower surface 214 of the wafer clamp ring 200. This embodiment is especially suitable when the wafer clamping assembly is present on the wafer support pedestal, as illustrated in FIG. 1 and FIG. 5.

Referring next to the embodiment of FIG. 10B, the outer support hole 220 of the wafer clamp ring 200 is tapered from the upper surface 212 toward the lower surface 214. In other words, the top diameter 222 of the outer support hole is greater than the bottom diameter 224 of the outer support hole. This embodiment is especially suitable when the wafer clamping assembly is mounted to the platform and hangs downward, as illustrated in FIG. 9.

Referring next to the embodiment of FIG. 10C, the outer support hole 220 of the wafer clamp ring 200 tapers from both the upper surface 212 and the lower surface 214 towards the middle of the hole, coming to a point near the middle.

In this embodiment, the top diameter 222 of the outer support hole is about equal to the bottom diameter 224 of the outer support hole. The top diameter 222 and the bottom diameter 224 are both greater than a middle diameter 226 of the outer support hole. This embodiment of the outer support hole could also be described as having an hourglass shape. Again, a linear taper is illustrated, but the taper can generally be of any shape, for example curved. This embodiment may be suitable for either wafer clamping assembly illustrated in FIG. 1 or FIG. 9.

The dry etching systems of the present disclosure use an improved wafer clamp ring which has outer support holes with a tapered shape. Put another way, the diameter of the outer support hole is not constant, but rather changes between a maximum diameter and a minimum diameter. This structure has reduced tolerance compared to a cylindrical hole. The wafer clamp ring structure of FIG. 5 has reduced tolerance at the top of the outer support hole, reducing the amount of horizontal shift that can occur to an acceptable amount. Similarly, the structures shown in FIGS. 10A-10C also have reduced tolerances for horizontal shift, due to a change in the diameter of the hole between the upper surface and the lower surface. In some particular embodiments, the level of possible shift is reduced to below about 0.35 mm. As a result, etch defects (portions being etched that should not be etched, or vice versa) are reduced.

Some embodiments of the present disclosure thus relate to dry etching processes. A wafer substrate is placed on a support pedestal. The support pedestal and upper electrode move relative to each other to reduce a gap between the support pedestal and the upper electrode. This movement causes a wafer clamping assembly to engage an edge of the wafer substrate, and also creates a plasma treatment volume along a front side of the wafer substrate and a backside cooling volume along a back side of the wafer substrate. The wafer substrate is then etched by generating a plasma in the plasma treatment volume. The wafer clamping assembly comprises a plurality of plunger assemblies and a wafer clamp ring. The wafer clamp ring comprises an annular body surrounding a central opening. The annular body includes a plurality of outer support holes extending through the annular body. Each outer support hole has a conical or hourglass shape.

Also disclosed are various processes for reducing horizontal shift of a wafer clamp ring in a dry etching system. A wafer clamp ring is secured to a plurality of plunger assemblies. The wafer clamp ring comprises a body having a central opening and a plurality of outer openings, wherein each outer opening has a tapered shape. Each plunger assembly comprises a pin that passes through an outer opening of the wafer clamp ring.

Also disclosed herein are various dry etching systems that comprise a support pedestal, an upper electrode, and a wafer clamp ring. The support pedestal contains a lower electrode and supports the wafer clamp ring. The upper electrode is located above the support pedestal and separated from the support pedestal by a variable gap height. The wafer clamp ring comprises a central opening and a plurality of outer support holes. Each outer support hole has a tapered shape that changes in diameter.

According to still another non-limiting aspect of the present disclosure, a wafer clamp ring is provided. The wafer clamp ring includes a central opening and a plurality of outer openings or support holes. Each outer opening has a tapered shape which changes in diameter between a maximum diameter and a minimum diameter. The wafer clamp ring comprises anodized aluminum or a ceramic material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A dry etching process, comprising:

placing a wafer substrate on a support pedestal;

moving the support pedestal relative to an upper electrode to reduce a gap between the support pedestal and the upper electrode, causing a wafer clamping assembly to move from a resting height and engage an edge of the wafer substrate and create a plasma treatment volume along a front side of the wafer substrate and a backside cooling volume along a back side of the wafer substrate; and etching the wafer substrate by generating a plasma in the plasma treatment volume;

wherein the wafer clamping assembly comprises a plurality of plunger assemblies and a wafer clamp ring, each plunger assembly including a pin at an upper end of a plunger assembly body and a cover;

wherein the wafer clamp ring comprises an annular body surrounding a central opening, the annular body including a plurality of outer support holes extending through the annular body;

wherein each outer support hole has a conical or hourglass shape, and the pin of each plunger assembly passes through one outer support hole and engages the cover to secure the wafer clamp ring to the plunger assembly such that the wafer clamp ring and the plunger assembly body move together vertically from the resting height until the edge of the wafer substrate is engaged by the wafer clamp ring, to reduce horizontal movement of the wafer clamp ring.

2. The process of claim 1, wherein the annular body of the wafer clamp ring comprises anodized aluminum or a ceramic material.

3. The process of claim 1, wherein the wafer clamping assembly is connected to the support pedestal such that the plurality of plunger assemblies move with the support pedestal and not the upper electrode.

4. The process of claim 1, wherein the upper electrode and the wafer clamping assembly are connected to a platform above the support pedestal.

5. The process of claim 1, wherein each plunger assembly further comprises a piston shaft and a compression spring within the piston shaft, and wherein the plunger assembly body is located within the piston shaft.

6. The process of claim 5, wherein the plunger assembly body further comprises a lip at a lower end thereof, and the lip is adapted to engage a stop surface of the piston shaft.

7. The process of claim 1, wherein the wafer clamping assembly has a total of three plunger assemblies, and the wafer clamp ring has three outer support holes.

8. The process of claim 1, further comprising cooling the wafer substrate by flowing a cooling fluid through the backside cooling volume.

9. The process of claim 8, wherein the cooling fluid is a liquid or a gas.

10. The process of claim 8, wherein the cooling fluid is helium gas.

11. The process of claim 1, wherein the gap between the support pedestal and the upper electrode is from about 1.1 cm to about 1.3 cm.

12. The process of claim 1, further comprising:

separating the upper electrode from the support pedestal after etching is complete; and raising the wafer substrate from the support pedestal.

13. A dry etching process, comprising:

placing a wafer substrate on a support pedestal;

moving an upper electrode relative to the support pedestal to reduce a gap between the support pedestal and the upper electrode, causing a wafer clamping assembly to move from a resting height and engage an edge of the wafer substrate and create a plasma treatment volume along a front side of the wafer substrate and a backside cooling volume along a back side of the wafer substrate;

etching the wafer substrate by generating a plasma in the plasma treatment volume; and cooling the wafer substrate by flowing a cooling fluid through the backside cooling volume;

wherein the wafer clamping assembly comprises a plurality of plunger assemblies and a wafer clamp ring, each plunger assembly including a pin at an upper end of a plunger assembly body and a cover;

wherein the wafer clamp ring comprises an annular body surrounding a central opening, the annular body including a plurality of outer support holes extending through the annular body; and wherein each outer support hole has a circular conical or hourglass shape, and the pin of each plunger assembly passes through one outer support hole and engages the cover to secure the wafer clamp ring to the plunger assembly such that the wafer clamp ring and the plunger assembly body move together vertically from the resting height until the edge of the wafer substrate is engaged by the wafer clamp ring, to reduce horizontal movement of the wafer clamp ring.

14. The process of claim 13, wherein the cooling fluid is a liquid or a gas.

15. The process of claim 13, wherein the wafer clamping assembly is connected to the support pedestal.

16. The process of claim 13, wherein each plunger assembly further comprises a piston shaft and a compression spring within the piston shaft, and wherein the plunger assembly body is located within the piston shaft.

17. The process of claim 13, further comprising:

separating the upper electrode from the support pedestal after etching is complete; and raising the wafer substrate from the support pedestal.

18. A dry etching process, comprising:

placing a wafer substrate on a support pedestal;

moving an upper electrode downwards towards the support pedestal to reduce a gap between the support pedestal and the upper electrode, causing a wafer clamping assembly to move from a resting height and engage an edge of the wafer substrate and create a plasma treatment volume along a front side of the wafer substrate and a backside cooling volume along a back side of the wafer substrate;

etching the wafer substrate by generating a plasma in the plasma treatment volume;

separating the upper electrode from the support pedestal after etching is complete; and raising the wafer substrate from the support pedestal;

wherein the wafer clamping assembly comprises a plurality of plunger assemblies and a wafer clamp ring, each plunger assembly including a piston shaft with a stop surface at an upper end thereof, a plunger assembly body having a pin at an upper end and a lip at a lower end, a compression spring within the piston shaft that biases the plunger assembly body towards the upper end of the piston shaft, and a cover;

wherein the wafer clamp ring comprises an annular body surrounding a central opening, the annular body including a plurality of outer support holes extending entirely through the annular body; and wherein each outer support hole has a circular conical or hourglass shape, and the pin of each plunger assembly passes through one outer support hole and engages the cover to secure the wafer clamp ring to the plunger assembly such that the wafer clamp ring and the plunger assembly body move together vertically from the resting height until the edge of the wafer substrate is engaged by the wafer clamp ring, to reduce horizontal movement of the wafer clamp ring.

19. The process of claim 18, wherein the wafer clamping assembly is connected to the support pedestal.

20. The process of claim 18, further comprising cooling the wafer substrate by flowing a cooling fluid through the backside cooling volume.

\* \* \* \* \*